United States Patent
Beusch

(10) Patent No.: US 6,677,569 B2
(45) Date of Patent: Jan. 13, 2004

(54) METHODS AND APPARATUS FOR PERFORMING SIGNAL PROCESSING FUNCTIONS IN AN ELECTRONIC IMAGER

(75) Inventor: John U. Beusch, Stow, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 203 days.

(21) Appl. No.: 09/977,132

(22) Filed: Oct. 12, 2001

(65) Prior Publication Data

US 2003/0226973 A1 Dec. 11, 2003

(51) Int. Cl.$^7$ ............................................... H01L 27/00
(52) U.S. Cl. ................................. 250/208.1; 250/214 R
(58) Field of Search ........................ 250/208.1, 214 R, 250/214.1, 370.08, 338.01, 370.09, 461.2; 348/207.99, 272, 294

(56) References Cited

U.S. PATENT DOCUMENTS

| | | |
|---|---|---|
| 3,858,200 A | 12/1974 | Henry |
| 4,419,692 A * | 12/1983 | Modisette et al. .......... 348/167 |
| 5,192,951 A | 3/1993 | Ko |
| 5,665,969 A | 9/1997 | Beusch |
| 6,248,990 B1 | 6/2001 | Pyyhtiä et al. |

FOREIGN PATENT DOCUMENTS

| | | |
|---|---|---|
| DE | 1762974 | 1/1966 |
| DE | 300 795 A7 | 4/1985 |
| EP | 0 757 474 A1 | 5/1997 |

OTHER PUBLICATIONS

Roger A. Panicacci et al., "128Mb/s Multiport CMOS Binary Active–Pixel Image Sensor", Feb. 1996, IEEE International Solid–State Circuits Conference. Digest of technical Papers, pp. 100–101, 427.

M.R. Maier et al., "A Sixteen Channel Peak Sensing ADC for Singles Spectra in the FERA Format", Oct. 1995, IEEE Nuclear science Symposium and Medical Imaging conference Record, vol. 1, pp. 302–304.

J.D. Berst et al, "Analog to Digital Converter", Nov. 1991, Conference Record of the 1991 IEEE Nuclear Science Symposium and Medical Imaging Conference, pp. 674–675, vol. 1 of 3.

Mansour I. Ishrid, "Modified Variable–Threshold A/D Converter", Mar. 1990, International Journal of Electronics, vol. 68. No. 3, pp. 483–487.

E–S. Eid and Eric R. Fossum, "IRET—A CCD Focal Plane Image Processor Chip", Proceedings of the SPIE, vol. 1107, p. 196–2000, (no date).

Dialog Web, file://C:\WINDOWS\Temporary %20 Interner%20 Files/OLKB3B2/john1.htm, Jun. 2001, pp. 1–33.

Dialog Web, file://C:\WINDOWS\Temporary %20 Internet%20 Files/OLKB3B2/john2.htm, Jun. 2001, pp. 1–20.

Dialog Web, file://C:\WINDOWS\Temporary %20 Internet%20 Files/OLKB3B2/john3.htm, Jun. 2001, pp. 1–64.

* cited by examiner

Primary Examiner—Que T. Le
(74) Attorney, Agent, or Firm—Daly, Crowley & Mofford, LLP

(57) ABSTRACT

An electronic imager capable of performing selectable signal processing functions on measured pixel signals includes fixed digital logic circuitry. The imager includes a detector array comprising a plurality of pixels, an analog-to-digital conversion circuit responsive to an output signal from at least one pixel and to at least one threshold signal for converting the pixel output signal into a digital signal, and a digital logic circuit responsive to the digital signal for providing an output signal related to the pixel signal by a selectable function. Different signal processing functions are selected by varying the threshold signal provided to the analog-to-digital conversion circuit.

21 Claims, 8 Drawing Sheets

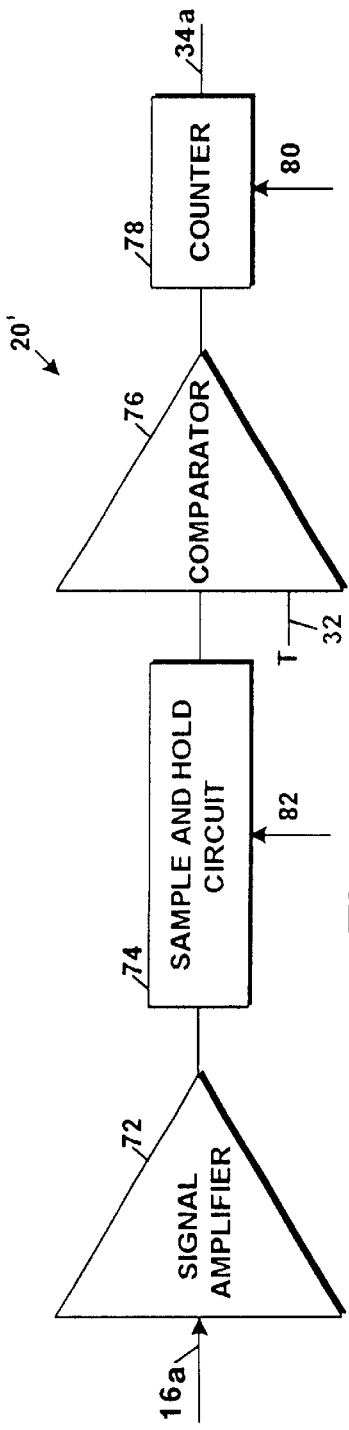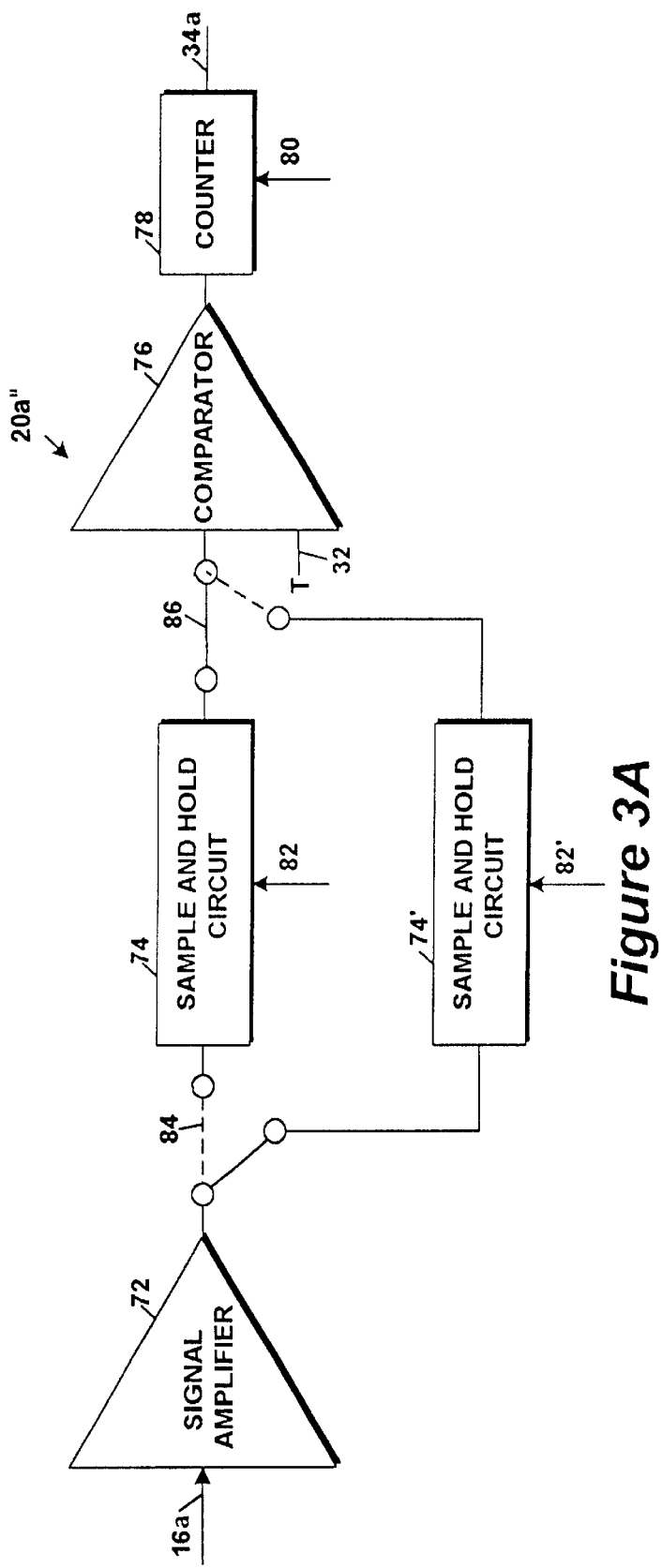
Figure 3
Figure 3A

METHODS AND APPARATUS FOR PERFORMING SIGNAL PROCESSING FUNCTIONS IN AN ELECTRONIC IMAGER

STATEMENT REGARDING FEDERALLY SPONSORED RESEARCH

This invention was made with government support under Grant No. F19628-00-C-0002 awarded by the Air Force. The government has certain rights in the invention.

CROSS-REFERENCE TO RELATED APPLICATIONS

Not applicable.

FIELD OF THE INVENTION

This invention relates to electronic imaging apparatus and techniques and more particularly to an electronic imager capable of performing selectable signal processing functions on the output signals of detector elements with fixed digital logic circuitry.

BACKGROUND OF THE INVENTION

Modern imaging has its roots in the nineteenth century with the advent of film which is used today for diverse applications, including generating common photographs and radiographic medical images using x-rays. Dunng the past ten to twenty years, electronic imaging has become common in many fields and has totally replaced film systems in some applications. The term "electronic imaging" as used herein includes electro-optical imaging in the infrared, visible, and ultraviolet regions of the spectrum, and also in the higher energy regions of the spectrum including soft and hard x-rays and gamma-rays.

In its simplest form, electronic imaging is performed by intercepting radiation in the form of photons from an object of interest or scene to be viewed. The photons may be generated by various sources, such as astronomical sources including the sun and stars, other sources of soft x-rays (photons with energy below 10 kev), x-ray tubes and other sources of hard x-rays (photons with energy equal to or above 10 kev), and gamma ray isotopes or other high energy sources of photons above 50 kev. The photons incident on the object to be viewed can be provided directly from an energy source or can be reflected by one or more objects.

Prior to interception, the photons can travel or transit through the earth's atmosphere, the near vacuum of outer space, water, tissue or organs or other elements of a patient in medical applications, other objects to be imaged and examined, or any other medium which may or may not degrade the image or provide information of interest. The photons may pass through lenses, be reflected by mirrors, or be affected by baffles or other components. The intercepted photons may be from one band of the electromagnetic spectrum, from more than one band (i.e., multi-spectral), from many bands (i.e., hyperspectral), or from all bands.

In electronic imaging, the interception of photons is accomplished by imaging, or detector arrays. Detector arrays typically are divided into detector, or picture elements (i.e., pixels) and include a plurality of pixels arranged in a linear array or two-dimensional array. The intercepted photons cause electrical signals in various analog forms, such as a voltage, current, or charge, to be generated by the detector elements. Commonly available detector array configurations for electronic imaging include point scan, slit scan, slot scan (sometimes referred to as "push broom") and fixed two-dimensional image receptors. Such detector arrays are commonly located in vehicles including aircraft and spacecraft, medical facilities, airports, industrial facilities, homes, offices, and a variety of other locations and can be subsystems of cameras or other equipment.

In many applications, the detector array is enabled to intercept photons for an interval of time (i.e., an imaging interval) and after that interval, the resulting electrical signal generated in each pixel is read out in some fashion and presented to a user or operator of the imager and/or is stored in a memory device for further image processing. It is sometimes necessary or desirable to measure pixel output signals many times during a single imaging interval and compute a function of the measured values. For example, in an x-ray detection system described in U.S. Pat. No. 5,665,969 entitled X-RAY DETECTOR AND METHOD FOR MEASURING ENERGY OF INDIVIDUAL X-RAY PHOTONS FOR IMPROVED IMAGING OF SUBJECTS USING REDUCED DOSE, a weighted sum function of many single photon measurements is computed during each imaging interval in order to improve the resulting image. The patent describes the use of a transistor switch for performing the weighted sum function in which the weighting given to a particular photon measurement is determined by resistance values of resistors and the transistor switch.

SUMMARY OF THE INVENTION

According to the invention, an electronic imager comprises a detector array including a plurality of radiation sensitive elements, a plurality of analog-to-digital conversion circuits, each responsive to an input signal from at least one of the radiation sensitive elements and to at least one threshold signal for converting the input signal into a digital signal, and a digital logic circuit. The digital logic circuit is responsive to the digital signal from at least one of the analog-to-digital conversion circuits and provides an output signal related to the input signal by a selectable function, wherein the function is selected by adjusting the threshold signal.

With this arrangement, different signal processing functions can be performed with common imager apparatus or a common imager design, thereby increasing the utility of the imager apparatus or design. As will become apparent, different signal processing functions include different function types (e.g., an exponential weighting function or an arbitrary function) and/or different function parameters (e.g., a different set of weights for a weighting function). For example, in a medical application, different signal processing functions may be used to enhance the imaging in different tissue types or as a function of different tissue characteristics such as tissue density and tissue thickness. Also, the imager apparatus or design may be used in different applications, such as medical and environmental monitoring applications, by varying the signal processing functions in a variable apparatus or a fixed, specialized apparatus which could be member of a family of apparatus which are variants of a common design. Further, this versatility is achieved in a manner which permits the use of digital logic circuitry, which is often preferable to analog circuitry for reasons of size, cost and simplicity.

The digital logic circuit is fixed (i.e., non-adjustable). The use of fixed digital logic circuitry is possible since it is the threshold signal provided to the analog-to-digital conversion circuit which is adjusted to select a particular signal processing function. This threshold signal adjustment may be made on a variable apparatus prior to or during use or during the manufacture or factory preadjustment of a specialized apparatus. Thus, the versatility of the imager apparatus or family of apparatus is achieved without the added cost of providing additional or variable digital logic circuits to implement different signal processing functions.

Also described is a method for processing an input signal from a radiation sensitive element with an electronic imager including the steps of converting the input signal into a digital signal by comparing the input signal to at least one threshold signal, processing the digital signal to provide an output signal having a relationship with respect to the input signal determined by the threshold signal, and adjusting the threshold signal in order to change the relationship between the output signal and the input signal. By adjusting the threshold signal, the above-described method can be used in various imaging applications.

An analog-to-digital conversion circuit according to the invention includes a comparator circuit responsive to an analog input signal and to a plurality of threshold signal levels for comparing the analog input signal to the threshold signal levels, and a control circuit for generating the threshold signal levels. At least one increment between adjacent threshold signal levels is not equal to increments between other adjacent threshold signal levels. In one embodiment, the comparator circuit includes a plurality of comparators, each receiving a respective threshold signal level substantially simultaneously. In an alternative embodiment, the plurality of threshold signal levels are provided sequentially to the comparator circuit.

The use of such an analog-to-digital conversion circuit in an electronic imager permits various signal processing functions to be performed on the pixel signals simply by adjusting the threshold signal levels and concomitantly, the increments between adjacent threshold signal levels according to the desired function. The described analog-to-digital conversion circuit can be contrasted to conventional analog-to-digital converters in which the increments between adjacent threshold levels are equal in order to provide a linear relationship between the analog input signal and the digital output signal.

BRIEF DESCRIPTION OF THE DRAWINGS

The foregoing features of this invention, as well as the invention itself, may be more fully understood from the following description of the drawings in which:

FIG. 3 is a schematic of a synchronous analog-to-digital conversion circuit responsive to an adjustable threshold signal according to a further embodiment of the invention;

FIG. 3A is a schematic of an alternative synchronous analog-to-digital conversion circuit containing circuit elements for capturing signals occurring during processing intervals;

FIG. 4 is a schematic of an illustrative digital logic circuit for use with the analog-to-digital conversion circuit of FIG. 2;

FIG. 6 is a schematic of an illustrative digital logic circuit for use with the analog-to-digital conversion circuit of FIG. 3;

DESCRIPTION OF THE PREFERRED EMBODIMENT

Figure 1:
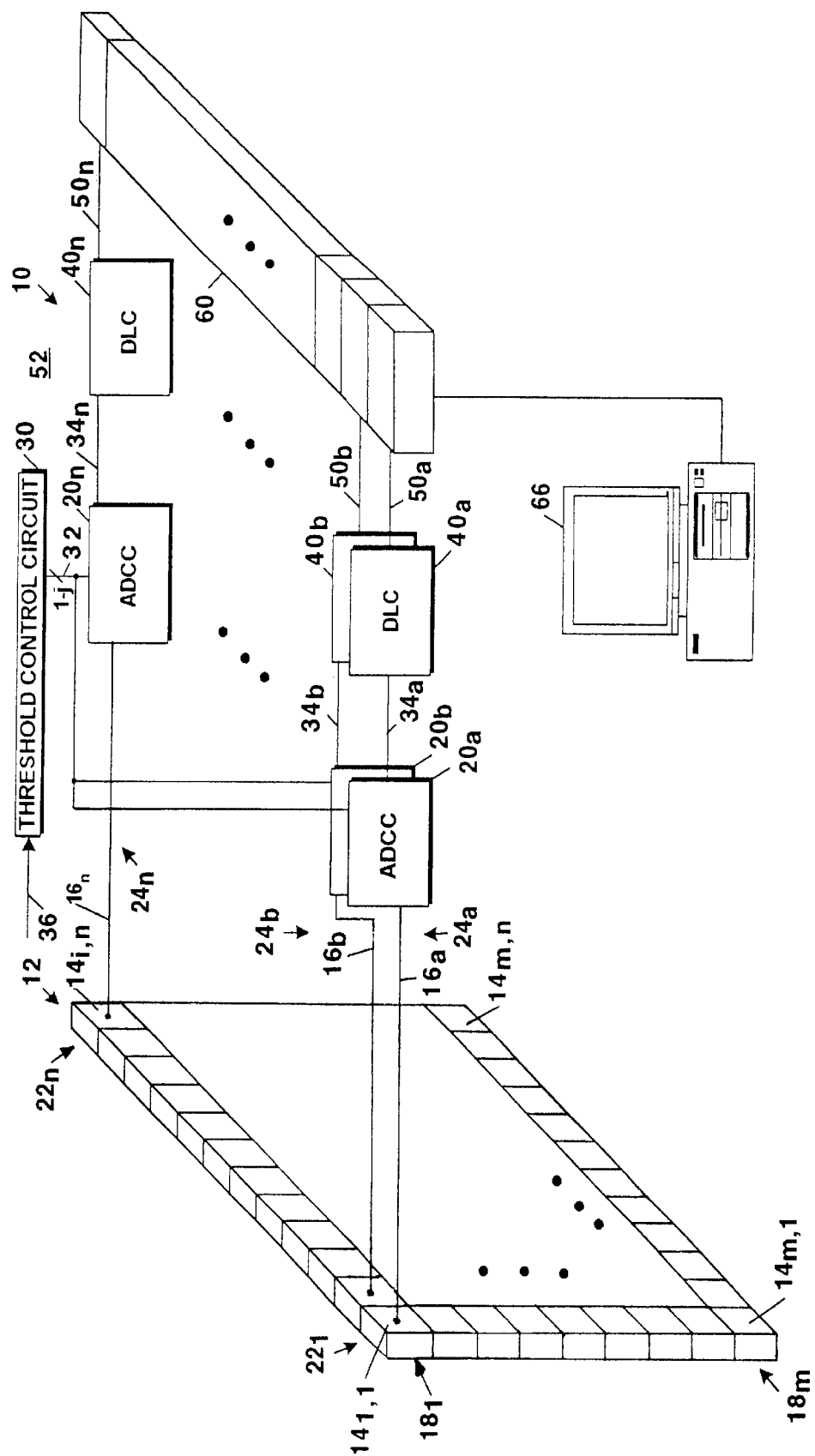
FIG. 1 is a block diagram of an electronic imaging system according to the invention.

Referring to FIG. 1, an electronic imaging system 10 includes an imaging array 12 comprising a plurality of radiation sensitive detector or picture elements, referred to as pixels $14_{1,1}$–$14_{m,n}$, a plurality of an analog-to-digital conversion circuits (ADCCs) 20a–20n, a threshold control circuit 30, and a plurality of digital logic circuits (DLCs) 40a–40n. According to the invention, each of the analog-to-digital conversion circuits 40a–40n is responsive to an input signal, or pixel signal 16a–16n from at least one of the radiation sensitive elements $14_{1,1}$–$14_{m,n}$ and to at least one threshold signal 32 for converting the input signal into a respective digital signal 34a 34n. Each digital logic circuit 40a–40n processes the digital signal 34a–34n from at least one of the analog-to-digital conversion circuits to provide an output signal 50a–50n related to the respective input signal 16a–16n by a selectable function. The function is selected by adjusting the threshold signal 32.

The digital logic circuits 40a–40n are "fixed" logic circuits in the sense that they are capable of performing a fixed, predetermined function and generally contain non-adjustable, non-programmable circuit elements. The digital logic circuits 40a–40n, together with the analog-to-digital conversion circuits 20a–20n and the threshold control circuit 30, form an "adjustable function processor" 52 capable of performing different, selectable functions on the input signals 16a–16n by adjusting the threshold signal 32.

With this arrangement, the imaging system 10 has significant versatility since different functions, both in terms of function type and function parameters, can be performed on the pixel signals 16a–16n, thereby permitting the system to be optimized. More particularly, the threshold signal 32 can be varied in order to permit use of the imager or its design in different applications, such as military or scientific applications, and/or to optimize the imager for different application parameters, such as optimization for imaging a particular tissue type or tissue density within a medical application.

The two-dimensional imaging array 12 includes a plurality of sub-array rows $18_1$–$18_m$ and a plurality of sub-array columns $22_1$–$22_n$, as shown. It will be appreciated by those of ordinary skill in the art that although the illustrated imaging array 12 is a two-dimensional array, the invention is applicable to any imaging array configuration, such as one containing only a linear array of elements $14_{1,1}$–$14_{1,n}$.

Each detector element $14_{1,1}$–$14_{m,n}$ provides an analog output, or pixel signal in response to various types of incident radiation in various wavelength bands, such as infrared, visible, ultraviolet, soft x-ray, hard x-ray, gamma ray and other high-energy particle bands. Further, the detector element output signals may be indicative of the number of incident photons or particles during a particular time interval, the energy level of an incident photon or particle, or an accumulation of energy levels from a plurality of incident photons or particles. Standard usage refers to the basic quantity of energy in some wavelength bands as a photon and in others as a particle. Such terms are used interchangeably herein, so when a photon is referred to it is understood to mean a photon or particle. Illustrative detector elements $14_{1,1}$–$14_{m,n}$ include charge-coupled devices (CCDs), photon capture layers of a semiconductor material which form a detector for visible, ultraviolet, or soft x-ray photons, a silicon microstrip detector, and a semiconductor device of high Z or high atomic weight material, medium Z or medium atomic weight material including but not limited to gallium arsenide, cadmium zinc telluride, mercury cadmium telluride, silicon, gallium, and indium.

The imager 10 includes a plurality of channels 24a–24n, each of which accepts an input from one or more pixels $14_{1,1}$–$14_{m,n}$ and includes the communication mechanisms and processing electronics for processing the respective input signal(s). For simplicity of illustration, only detector elements $14_{1,1}$–$14_{1,n}$ are shown to provide analog pixel signals 16a–6n for processing. In the illustrative embodiment, each channel 24a–24n accepts an input signal 16a–16n from a single respective pixel $14_{1,1}$–$14_{1,n}$ and the number of pixels 1–n appears to equal the number of channels a–n; however, this need not be the case and there need not be any particular relationship between the number of channels and the number of rows or columns. Alternately for example, some or all channels may accept inputs from a row $18_1$–$18_m$ or a column $22_1$–$22_n$ of the array 12 or from some other subarray.

Each of the analog pixel signals 16a–16n is coupled by a coupling mechanism to an analog-to-digital conversion circuit 20a–20n, as shown. The coupling mechanism may take various forms depending on the type of imaging array. For example, the coupling mechanism may include portions of semiconductor material or metallic bonding pads comprising or connected to the pixels, conductive traces, indium "bumps" or elements of a read-out integrated circuit (ROIC) such as a CCD. The analog-to-digital conversion circuit and the detector may be implemented in the same element, (e.g., semiconductor device) in which case the coupling mechanism will be integral to that element.

Figure 2:
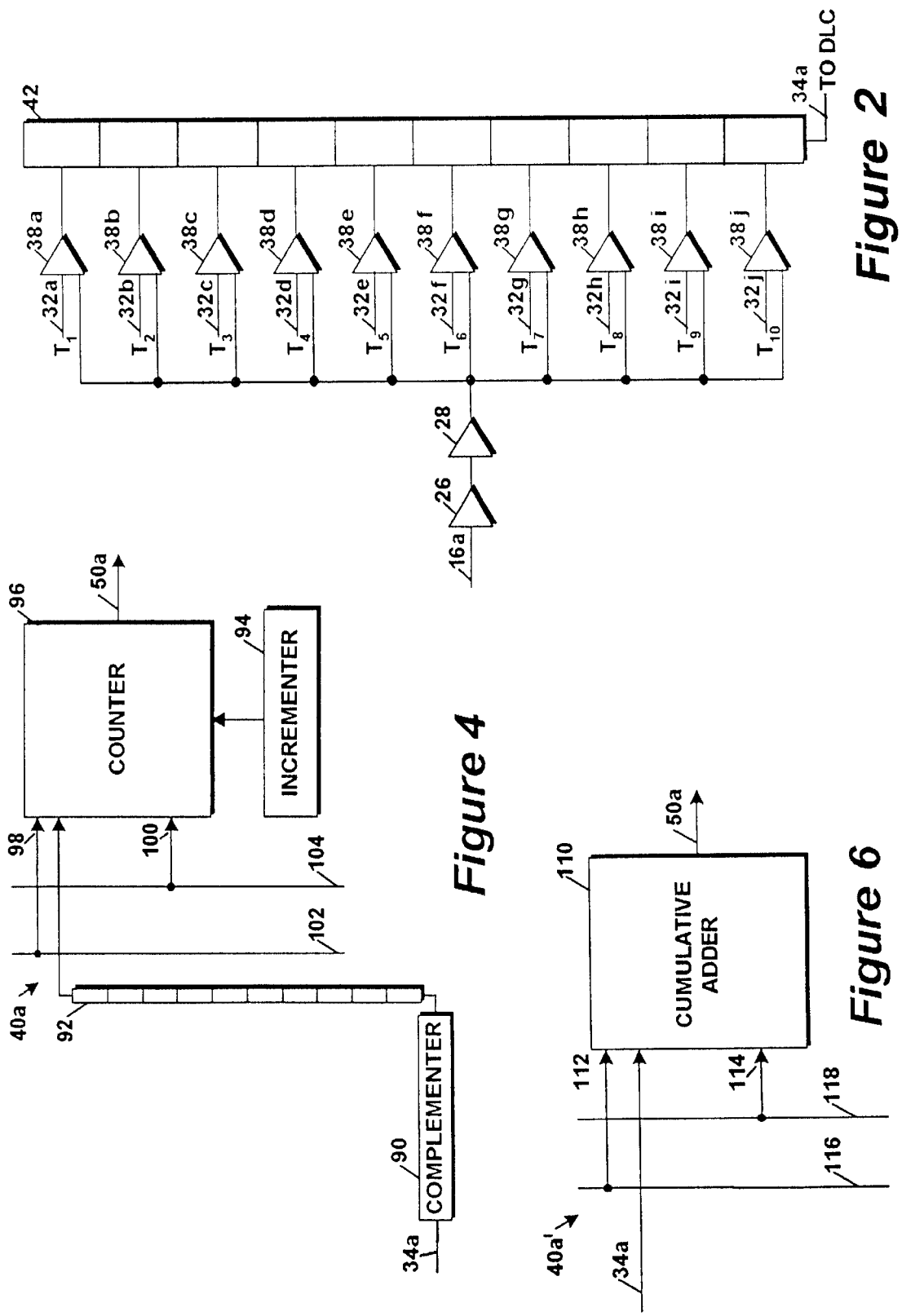
FIG. 2 is a schematic of an asynchronous analog-to-digital conversion circuit responsive to adjustable threshold signals according to the invention.

The analog-to-digital conversion circuits 20a–20n convert the respective input signal 16a–16n into a corresponding digital signal 32a–32n according to at least one adjustable threshold signal 32 provided by the threshold control circuit 30, as will be described. The analog-to-digital conversion circuits 20a–20n may take various forms, such as an integrating type or a direct type. Illustrative integrating analog-to-digital conversion circuits include single slope or ramp integrating, dual slope integrating, charge balancing dual-slope, charge-balancing or charge-reset voltage to frequency, synchronous voltage to frequency, charge-reset voltage to frequency, and charge-balancing voltage to frequency. Illustrative direct type analog-to-digital conversion circuits include counter, counter ramp, successive approximation multistep parallel, two-step parallel, parallel flash, counter ramp and continuous counter ramp, pipelined counter ramp, pipelined successive approximation, multi-stage pipelined successive approximation, pipelined parallel, two-stage pipelined parallel tracking, pipelined successive approximation, multi-step parallel, multistage parallel pipelined, charge redistribution and delta-sigma oversampled. The analog-to-digital conversion circuit may be of the charge domain implementation type, i.e., be implemented in the charge domain. Illustrative direct type analog-to-digital conversion circuits are shown in FIGS. 2, 3, and 3A.

Although the analog-to-digital conversion circuits 20a–20n may be provided with any of these conventional topologies, the circuits 20a–20n differ from conventional analog-to-digital converters in that each circuit 20a–20n is responsive to at least one adjustable threshold signal 32 by which one or more adjustable threshold signal levels are provided. The threshold signal levels are set and/or adjusted in order to perform a particular signal processing function prior to use of the imaging system 10, such as by adjustment of user actuable controls and/or by preadjustment during manufacture. The threshold signal(s) may take the form of a current, voltage, or optical (light) signal. Choice of the analog-to-digital conversion circuit depends on various factors, such as the number of channels required, the number of threshold signal levels required to adequately approximate the desired function, the speed of sampling, and dynamic range.

According to another aspect of the invention, the threshold signal levels provided to the analog-to-digital conversion circuits 20a–20n can be adjusted so as to provide unevenly spaced intervals between adjacent threshold signal levels. Stated differently, the threshold signal levels can be adjusted so that at least one increment between adjacent threshold signal levels is not equal to increments between other adjacent threshold levels. This is in contrast to threshold signals used in conventional analog-to-digital converters to reduce the number of comparators required to implement the conversion (i.e., use the same comparator with different thresholds several times per conversion).

Figure 8:
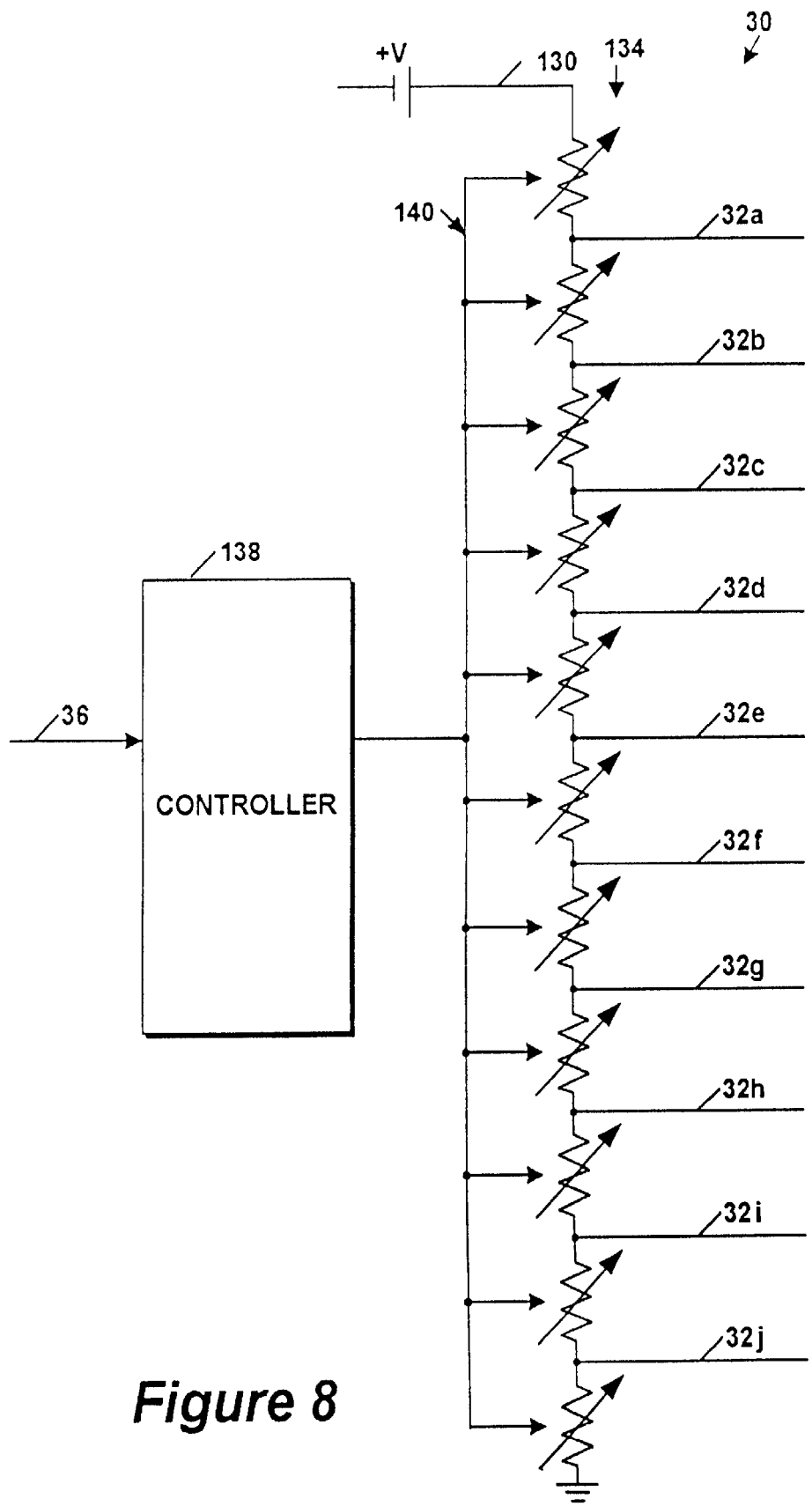
FIG. 8 is a schematic of an illustrative threshold control circuit for use with the analog-to-digital conversion circuit of FIG. 2.

The threshold control circuit 30 is responsive to an input 36 for generating at least one adjustable threshold signal 32 for use by the analog-to-digital conversion circuits 20a–20n according to the desired signal processing function to be performed. Whether the threshold signal 32 is provided in the form of a single signal coupled to each analog-to-digital conversion circuit 20a–20n or a plurality of different signals coupled to each analog-to-digital conversion circuit 20a–20n depends on the type of analog-to-digital conversion circuit 20a–20n. In particular, an asynchronous analog-to-digital conversion circuit of the type shown in FIG. 2 is responsive to a plurality of individual threshold signals 32a–32j, each having a different threshold signal level. An illustrative circuit for providing the threshold signals 32a–32j is shown in FIG. 8. A synchronous analog-to-digital conversion circuit of the type shown in FIG. 3 is responsive to a single, time-varying threshold signal 32 which provides different threshold signal levels 32a–32x at different times, as may be provided by the illustrative circuit of FIG. 9.

The input 36 to the threshold control circuit 30 may be provided by various means and from various sources. As one example, the input 36 may be provided by various methods of factory preadjustment. As another example, an operator, image interpreter, system designer, or other person or machine may provide the input 36 such as with user actuable controls to cause the threshold signal levels to be varied according to application specifics. In this type of arrangement, the threshold control circuit 30 includes a user interface, such as a keyboard or other input mechanism and may prompt the operator for information based on the type of application and other parameters related to the imaging task. As one example, a first control permits an operator to select the type of application, for example x-ray or observation of transient environmental phenomena. A second control specific to a particular application, such as x-ray imaging, permits the operator to input data describing the object to be imaged, such as a tumor, and a further control permits the operator to input data describing the tissue type being imaged. The threshold control circuit 30 is shown as a single unit, although it may be implemented as multiple subsystems, distributed among the channels 24a–24n.

The digital signal 34a–34n provided by each of the analog-to-digital conversion circuits 20a–20n is coupled via a coupling mechanism to a fixed digital logic circuit 40a–40n, as shown. Illustrative digital logic circuits are shown in FIGS. 4 and 6. Although the digital logic circuits 40a–40n are fixed, or non-adjustable, and therefore are simple and relatively inexpensive to implement, the signal processing functions performed on the pixel signals are pre-adjustable, adjustable, variable, changeable, or selectable, such terms being used interchangeably herein to describe that some aspect of the signal processing function (e.g., the function type and/or parameters) can be modified. This "variability" is achieved by a combination of the fixed digital logic circuits 40a–40n and the analog-to-digital conversion circuits 20a–20n which are responsive to adjustable threshold signal levels as provided by the threshold control circuit 30. As a result of this arrangement, the transfer function, or relationship between the digital output signals 50a–50n and respective digital input signals 34a–34n is fixed; whereas, the transfer function or relationship between digital output signals 50a–50n and respective pixel signals 16a–16n is variable.

The digital output signal 50a–50n of each digital logic circuit 40a–40n is coupled to a shift register 60 or other signal collection mechanism which collects and passes the data to a computer 66 or any other system element and/or to an operator. The data collection function of the shift register 60 may be performed by a variety of logic or processing means depending on the application, including but not limited to more general registers, accumulators, storage or memory devices. The functions performed by the computer 66 may include further processing, display and/or analysis and may be performed by a variety of computational or processing means depending on the application, including but not limited to hard-wired or programmable processors, microprocessors or array processors. Alternatively, the functions performed by computer 66 may be omitted and the data passed directly to a display, storage device, or other system element.

It will be appreciated by those of ordinary skill in the art that although FIG. 1 illustrates a one-to-one correspondence between the analog-to-digital conversion circuits 20a–20n, the digital logic circuits 40a–40n, and the pixels $14_{1,1}$–$14_{1,n}$ of the sub-array $18_1$, this need not be the case and should not be construed to limit the scope of the invention. This invention applies to any number of analog-to-digital conversion circuits and digital logic circuits which can be connected in various arrangements to the detector array 12, including but not limited to pixel by pixel as shown, by row of pixels, by column of pixels, or by any other subset of pixels of any shape. Further, the analog-to-digital conversion circuits 20a–20n and the digital logic circuits 40a–40n can be implemented by any number of physical units, including a single, multiplexed unit. That is, several channels may share a common analog-to-digital conversion circuit and/or digital logic circuit, for example, by storing data in memory or holding samples and time sharing fast circuits.

In the illustrative embodiment, it is contemplated that each of the analog-to-digital conversion circuits 20a–20n is identical and receives the same threshold signal or signals 32 from the control circuit 30. Also, each of the digital logic circuits 40a–40n is identical. However, it will be appreciated by those of ordinary skill in the art that although certain efficiencies may be gained by using identical circuits in terms of cost and circuit complexity, this is not necessary and does not limit the scope of the invention.

Referring to FIG. 2, an illustrative analog-to-digital conversion circuit 20a adapted to receive a plurality of adjustable threshold signals 32a–32j is shown. The analog-to-digital conversion circuit 20a includes a signal amplifier 26 and a signal shaper 28. The amplifier and shaper are conventional components for amplifying and shaping the input pixel signal 16a in order to improve processing results. However, depending on signal levels, noise levels, and other characteristics of the input pixel signal 16a, the amplifier and/or shaper may be omitted. In cases where the analog-to-digital conversion circuit and the detector are implemented in the same element, the amplifier and shaper, if required, would be implemented in that element. In some applications, the signal shaper 28 may be replaced by a sample and hold circuit.

The output of the signal shaper 28 is coupled to the non-inverting input of each of a plurality of comparators 38a–38j. Each of the threshold signals 32a–32j has a respective threshold signal level $T_1$–$T_{10}$, and is coupled to the inverting input of a respective comparator 38a–38j, as shown. As described above, the threshold signals 32a–32j are generated by, or preadjusted with the threshold control unit 30 according to a desired signal processing function to be performed on the input signal 16a. In one illustrative embodiment described further below, the analog-to-digital conversion circuit 20a is used in conjunction with the digital logic circuit 40a of FIG. 4 in order to implement a decreasing exponential function shown in FIGS. 5 and 5A.

Preferably, the threshold signals 32a–32j are generated or preadjusted to have decreasing signal levels so that $T_1 > T_2 > T_3 \ldots T_9 > T_{10}$, with the levels being spaced by increments determined by the desired function, as will be described below. It will be appreciated by those of ordinary skill in the art that alternatively, the levels may be increasing or even non-monotonic. This may increase circuit complexity in some embodiments since additional circuitry may be necessary in order to reorder the resulting bits, but in the embodiment of FIGS. 2 and 4, no reordering would be required.

Each comparator 38a–38j provides a single bit output signal to a bit storage device 42, such as a shift register. At the end of each sampling cycle, the ten bits in the bit storage device 42 are shifted onto an output line 34a for coupling to the respective digital logic circuit 40a (FIG. 1) for further processing. This end of the sampling cycle occurs asynchronously just long enough after a photon arrival to capture its resulting signal data; alternatively it can occur periodically with a sufficiently short period that the probability of two photon arrivals in a period is negligible.

In operation, upon the arrival of a photon on pixel $14_{1,1}$, the signal shaper 28 generates a pulse for coupling to the comparators 38a–38j. The amplitude of the pulse is determined by the energy of the intercepted photon in single photon detection applications. The output signal of any of the comparators 38a–38j in which the input pulse exceeds the respective threshold signal 32a–32j is set to a logic high level (i.e., at one) and is held by the register 42 for some specified time or until some specified event occurs. In particular, the register 42 is triggered to read out the comparison results just after the arrival of a photon (triggered by the photon arrival) or at a rate selected such that the likelihood of arrival of more than one photon in each pixel during a readout period is negligible, as described in the above-referenced U.S. Pat. No. 5,665,969. For those comparators in which the input pulse does not exceed the respective threshold signal, the output signal remains at a logic low level (i.e., at zero). The pulse from shaper 28 may exceed none, some, or all of the threshold signals 32a–32j. Consider for example the case where the input pulse exceeds only threshold levels $T_9$ and $T_{10}$. In this case the digital signal on line 34a is 1100000000. As another example, if threshold levels $T_5$, $T_6$, $T_7$, $T_8$, $T_9$, $T_{10}$ are exceeded, then the digital signal on line 34a is 1111110000.

It will be appreciated by those of ordinary skill in the art that the number of comparators 38a–38j in the circuit 20a may be varied. In general, the more comparators, the more accurate the approximation to the desired function. However, this increased accuracy is achieved at a cost and complexity of more circuitry.

The circuit 20a can be described as asynchronous, or event driven in the sense that the input signal 16a from the respective pixel $14_{1,1}$ is processed upon arrival of a photon. It is most desirable to complete operations of the circuit of FIG. 2 as rapidly as possible to prepare for the next arrival since the signal resulting from a subsequent photon may be lost if it arrives while the previous photon is being processed. Sufficiently rapid operation ensures that the probability of a lost signal is acceptably small. Though the comparators, in a sense, operate continuously, they only provide an output upon a photon arrival. They complete their work for a photon arrival and are prepared for the next when their outputs are transferred to register 42. Thus, the analog-to-digital conversion circuits 20a–20n (FIG. 1) operate at different times determined by photon arrivals to compare the energy of a received photon with a respective threshold signal.

The circuit 20a could also be operated in a synchronous fashion with the passage of data to register 42 triggered at a high rate selected to detect individual photon arrivals, (i.e., to avoid multiple arrivals in a cycle). In this case, the analog-to-digital conversion circuits 20a–20n can operate at the same time on the same cycle.

Referring to FIG. 3, an alternative analog-to-digital conversion circuit 20a', which can be characterized as synchronous, includes a signal amplifier 72 and a sample and hold circuit 74. The signal amplifier 72 may or may not be necessary depending on signal and noise levels of pixel signal 16a from detector array 12. The sample and hold circuit 74 periodically samples the output signal of the amplifier 72 and holds the sampled signal at a non-inverting input of a comparator 76 while the threshold signal 32 cycles through a plurality of different signal levels, such as sixty-three signal levels $T_1$–$T_{63}$, under the control of the threshold control unit 30. The sample and hold circuits 74 of all of the analog-to-digital conversion circuits 20a–20n (FIG. 1) operate synchronously under the control of a signal 82 from the threshold control circuit 30 in order to simultaneously sample and hold the respective input signal.16a–16n while the threshold signal 32 cycles through a sequence of levels. The sample rate is selected to ensure that the sampling cycle is long enough to permit the threshold signal 32 to cycle through the signal levels $T_1$–$T_{63}$.

The output of the comparator 76 is coupled to a counter 78 which is incremented by a signal 80 from the threshold control circuit 30 at the same rate as the threshold signal 32 cycles through signal levels. When the held signal exceeds the threshold signal 32, the output of the comparator transitions and inhibits or disables the counter 78, causing the counter to stop counting. The counter output signal 34a is coupled to the respective digital logic circuit 40a (FIG. 1) and processing continues by sampling the input signal 16a again at the next processing cycle.

Figure 7:
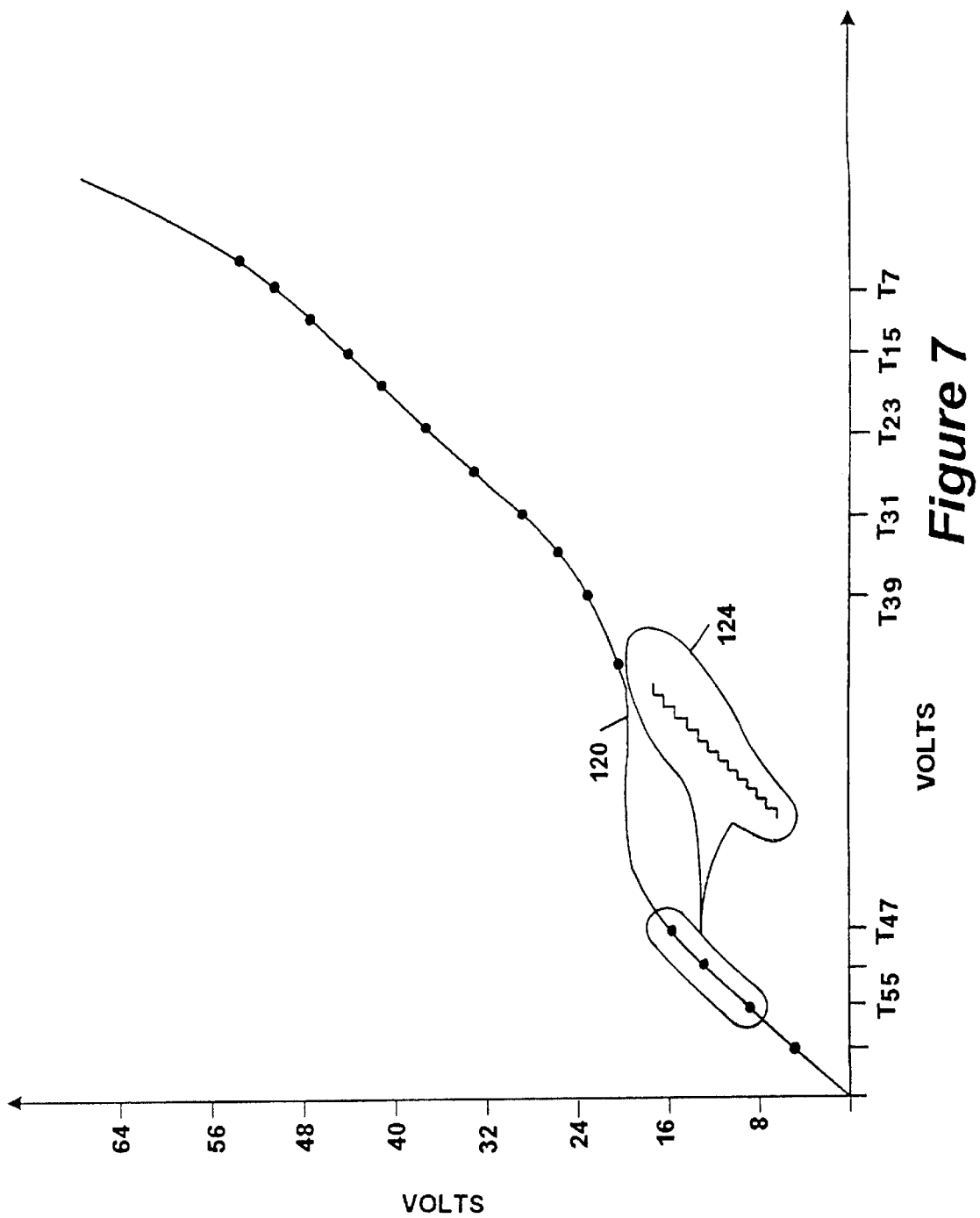
FIG. 7 is a curve illustrating the signal processing function implemented with the analog-to-digital conversion circuit of FIG. 3 and the digital logic circuit of FIG. 6.

In the illustrative embodiment, the analog-to-digital conversion circuit 20a' is used in conjunction with the digital logic circuit 40a' of FIG. 6 in order to implement the arbitrary function of FIG. 7. In this embodiment, the threshold signal 32 sequences through sixty-three decreasing signal levels $T_1$–$T_{63}$. The illustrative counter 78 is a six bit counter selected in order to match the approximation resolution provided by the sixty-three threshold signal levels. It will be appreciated by those of ordinary skill in the art that the number of threshold levels and bits provided by counter 78 may be varied, with more threshold levels providing a more accurate approximation of the function, but at the cost of slower circuit speed since the threshold signal 32 will have to cycle through more signal levels, and greater circuit cost and complexity.

In operation, the sample and hold circuit 74 is initialized to sample and then hold its input signal for as long as it takes the threshold control circuit 30 to cycle through the sixty-three signal levels. The smallest signal level $T_{63}$ of the sixty-three signal levels is applied to the comparator 76 first. If the held signal is smaller than signal level $T_{63}$, then the output signal of comparator 76 transitions and stops counter 78 at its starting value of 000000, thereby inhibiting the counter from incrementing again until the threshold signal 32 has cycled through all sixty-three threshold values and a new sample and hold operation is performed. The threshold control unit 30 then increments counter 78 via control signal 80, if it is not inhibited. The threshold control unit 30 then applies the next highest threshold level $T_{62}$ to the comparator 76. If the held signal is larger than threshold level $T_{63}$ but smaller than threshold level $T_{62}$, then the output signal of comparator 76 transitions, thereby inhibiting counter 78 at a count value of 000001. This process is repeated until the largest threshold level $T_1$ is reached and counter 78, if not inhibited, provides a count value of 111111. As will now be apparent, the count value provided by the counter 78 increases by one increment each time a new, higher threshold level is applied to the comparator 76 until the applied threshold level exceeds the held signal, at which time the counter is inhibited by the output of comparator 76 providing a final count value. The final count value is coupled to the respective digital logic circuit 40a' (FIG. 6) via signal line 34a.

In FIG. 3, the sample and hold circuit 74 holds the sampled signal at a non-inverting input of comparator 76 while the threshold signal 32 cycles through a plurality of different signal levels such as sixty-three signal levels $T_1$–$T_{63}$ as previously stated. During this cycling, photon arrivals may be missed. If the arrival rate is high enough that this presents a problem, the alternate embodiment 20a" of FIG. 3A may be employed where a second sample and hold circuit 74' and its control signal 82' are shown along with two dual-position switches 84 and 86. When switch 84 is in the down position to allow the output of amplifier 72 to be sampled by the lower sample and hold circuit 74', switch 86 is in the up position to allow the upper sample and hold circuit 74 to hold its sampled signal at the non-inverting input of comparator 76. When switch 84 is in the up position, switch 86 is in the down position; switches 84 and 86 are controlled to change their positions simultaneously.

Since in FIG. 2 the parallel arrangement of comparators 38a–38j allows very rapid or "flash" operation, a refinement similar to that of FIG. 3A would not be expected to be necessary; it is the more time consuming cycling of the threshold signal 32 which may make the refinement of FIG. 3A desirable or necessary.

Figure 5:
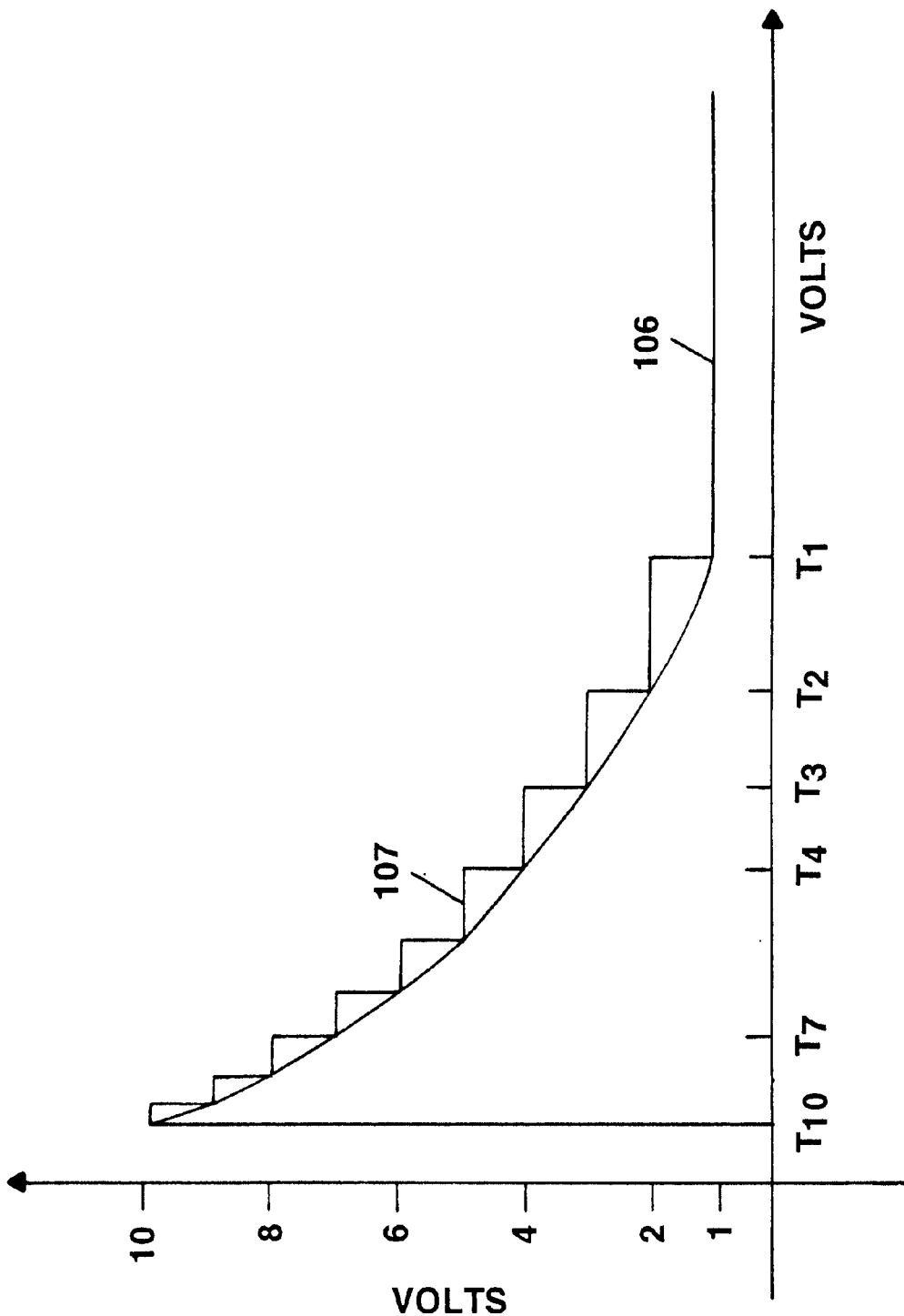
FIG. 5 shows a curve illustrating the signal processing function approximated with the analog-to-digital conversion circuit of FIG. 2 and the digital logic circuit of FIG. 4 and the resulting approximation curve.
Figure 5A:
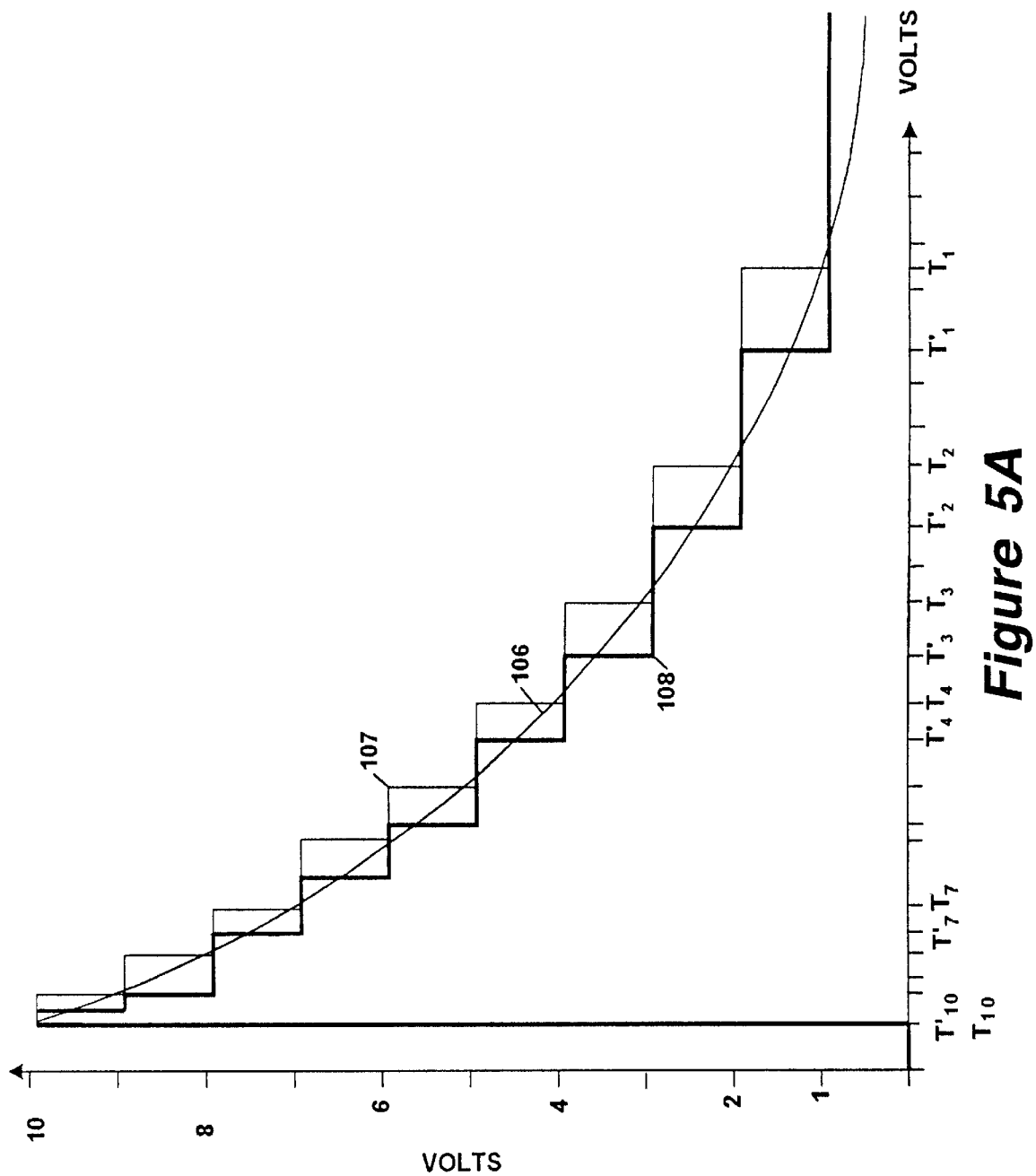
FIG. 5A shows the signal processing function curve of FIG. 5 and an alternative approximation curve achieved with the analog-to-digital conversion circuit of FIG. 2 and the digital logic circuit of FIG. 4, but with different threshold signal levels than used to achieve the approximation shown in FIG. 5.

Referring to FIG. 4, an illustrative digital logic circuit 40a of a type suitable for use with the analog-to-digital conversion circuit 20a of FIG. 2 in order to generate a decreasing exponential function shown in FIG. 5 includes a complementer 90, a shift register 92, and a counter 96. The complementer 90 receives a bit stream on signal line 34a from the respective analog-to-digital conversion circuit 20a (FIG. 2) and inverts the bits by changing all ones to zeros and all zeros to ones. The complemented bit stream is passed through an optional ten bit shift register 92 to buffer the ten bit signal from analog-to-digital conversion circuit 20a.

In operation, after counter 96 is reset to zero at the beginning of an imaging interval, the digital logic circuit 40a receives and complements the bit stream from the asynchronous analog-to-digital conversion circuit 20a (FIG. 2) which is sent forward when the lowest threshold level $T_{10}$ is exceeded, and stores the complemented bits in shift register 92. A value of zero stored in the shift register 92 corresponds to the respective threshold level being exceeded. Thus, when the shift register contains all zeros, all ten threshold levels $T_1$–$T_{10}$ are exceeded, whereas when the shift register contains nine ones, only threshold level $T_{10}$ is exceeded.

The counter 96 is incremented by one for each received bit having a value of one and an incrementing circuit 94 increments the count value by one during each processing cycle. A parallel load input 98 of the counter is coupled to the parallel load input of counters contained in the other identical digital logic circuits (FIG. 1) via a signal line 102 in order to trigger each of the digital logic circuits to simultaneously read out the counter output to shift register 60 (FIG. 1) at the end of the imaging interval. When read out, the counter output may be large since many asynchronous events may have occurred during the imaging interval. A reset input 100 to the counter 96 is coupled to a reset input of counters contained in the other identical digital logic circuits via a signal line 104 in order to simultaneously reset the counters to zero at the beginning of a new imaging interval.

Further to the examples presented in conjunction with FIG. 2, if the input pulse exceeds only threshold signal levels $T_9$ and $T_{10}$ and the signal 34a from the analog-to-digital conversion circuit 20a is 1100000000, the output of complementer 90 is 0011111111. This bit stream causes the counter 96 to increase its stored count by eight (once for each one in the input bit stream) and to provide a total count increase of nine as a result of the incrementing circuit 94. As another example, if threshold levels $T_5$, $T_6$, $T_7$, $T_8$, $T_9$, $T_{10}$ are exceeded and the signal 34a from the analog-to-digital conversion circuit 20a is 1111110000, then the complementer 90 provides a digital word of 0000001111 to the counter. The counter 96 thus counts up four in response to the input bit stream and is incremented by one by the incrementing circuit 94 to provide a total count increment of five for this threshold crossing.

It will be appreciated by those of ordinary skill in the art that various modifications can be made to the digital logic circuit 20a of FIG. 4. For example, the shift register 92 may be omitted and the complemented bit steam coupled directly to the counter 96. As another example, the digital logic circuit 40a can be modified to implement an increasing exponential function by omitting the complementer 90. In this example, a value of one stored in the shift register 92 corresponds to the respective threshold being exceeded so that upon threshold crossing, counter 96 is incremented by the number of thresholds crossed plus one since incrementing circuit 94 is included; the incrementing circuit may be omitted in another example. It should be noted that the threshold levels $T_1$, $T_2$, $T_3$, . . . $T_{10}$ in FIG. 3 need not be applied to comparator 38 in any particular ascending or descending order as long as the crossing of the lowest threshold $T_{10}$ is applied to trigger asynchronous operation of the analog-to-digital conversion circuit of FIG. 2; only the number of thresholds crossed is used by the digital logic circuit of FIG. 4.

Referring also to FIG. 5, a curve 106 illustrates the desired decreasing exponential function to be approximated with the analog-to-digital conversion circuit 20a of FIG. 2 and the digital logic circuit 40a of FIG. 4. As is apparent, the threshold levels $T_1$–$T_{10}$ have decreasing values $T_1 > T_2 > T_3$ . . . . Further, the spacing between adjacent threshold levels is selected in order to achieve an approximation to the particular desired function. In particular, the spacing between adjacent threshold levels decreases approximately exponentially for the exponential curve 106.

More particularly, in order to implement the decreasing exponential function 106 of FIG. 5, with the vertical axis (ordinate) values of the integers 1 through 10 as shown, as approximation 107, the threshold levels $T_1$ through $T_{10}$ are chosen to be the horizontal axis (abscissa) values which cause the function to equal the integers 1 through 10. More specifically, if the desired function 106 being approximated is y=f(x), then the threshold signal levels may be determined from the equations $1=f(T_1)$, $2=f(T_2)$, $3=f(T_3)$, . . . $10=f(T_{10})$. Consideration of the above-described examples and the curve 106 of FIG. 5 reveals that the desired function is achieved. Specifically, when the pixel signal 16a exceeds threshold levels $T_9$ and $T_{10}$, an output signal 50a of value nine is provided and when the pixel signal 16a exceeds threshold levels $T_5$–$T_{10}$, an output signal 50a of value five is provided.

It should be noted that the convenience for digital circuit implementation of restricting f(x) to take on particular integer values does not represent a limitation but is merely a normalization. By simply changing the gain of amplifier 26 (FIG. 2) or more conveniently, multiplying all image values by a constant in computer 66 (FIG. 1) any effects of this normalization can be removed.

Limiting the number of integers limits the accuracy of the fit between the desired function y=f(x) as shown by curve 106 and the actual function realized by the integer values as shown by approximation 107. Increasing the number of integer values and hence the number of threshold levels and thus the number of comparators increases the accuracy of the approximation at the expense of increased circuit complexity. An alternative way to provide a closer approximation to the desired function can be achieved with the same circuit complexity by determining nine modified thresholds $T_i'$ from the equations $T_i'=\frac{1}{2}[T_i+T_{i+1}]$ for i=1, 2, 3, . . . 9 and setting $T_{10}'=T_{10}$. The resulting approximation is illustrated by curve 108 in FIG. 5A. Approximation 108 may be more desirable than approximation 107 since curve 108 is not always greater than the desired function 106 but rather has values sometimes above and sometimes below the desired function curve 106. It will be appreciated by those of ordinary skill in the art that other approaches to curve fitting may be used. For example, the modified thresholds $T_i'$ can be selected using the equations $T_i'=K[T_i+T_{i+1}]$ for i=1, 2, 3, ... 9 and setting $T_{10}=T_{10}$ while choosing K to ensure that the area under curve 106 equals the area under approximation curve 108. Alternatively one can employ standard error minimization techniques such as least square to ensure a close fit between desired curve 106 and approximation curve 108.

Referring to FIG. 6, an alternative digital logic circuit 40a' for use with the synchronous analog-to-digital conversion circuit 20a' or 20a" (FIGS. 3, 3A) for generating the arbitrary function of FIG. 7 includes a cumulative adder 110. The cumulative adder 110 receives a bit stream from the analog-to-digital conversion circuit and has a parallel load input 112 coupled to the parallel load input of cumulative adders of the other digital logic circuits via a signal line 116, a reset input 114 coupled to the reset input of cumulative adders of the other, identical digital logic circuits (FIG. 1) via a signal line 118, and a bit stream load input 115 coupled to the bit stream load input of cumulative adders of the other digital logic circuits via a signal line 119. The output signal 50a of the cumulative adder 110 is coupled to the shift register 60 (FIG. 1).

In operation, after cumulative adder 110 is reset to zero at the beginning of an imaging interval, an input load signal on line 119 causes the bit stream input signal 34a to be repeatedly loaded into the cumulative adder 110 during the imaging interval. The signal on line 119 causes bit streams to be synchronously loaded on the plurality of cumulative adders of the digital logic circuits. The cumulative adder 110 provides an output signal indicative of the sum of the repeated loadings in order to provide a cumulative total of the digital words received during an imaging interval. With this arrangement, the functional values from the pixel signals from many photons received during the imaging interval are summed as is desirable in some applications. The summed output of the cumulative adder is uploaded to shift register 60 (FIG. 1) by a signal on line 116 at the end of each imaging interval. The cumulative adder is reset to zero by a signal on line 118 at the beginning of each imaging interval.

Consider an example in which the imaging interval corresponds to the arrival of three photons (although more typically, an imaging interval spans many more photon arrivals). Consider further the case where the first photon generates a pixel signal which is smaller than signal level $T_{63}$, the second photon generates a pixel signal which is larger than threshold level $T_{55}$ but smaller than threshold level $T_{54}$, and the third photon generates a pixel signal which is larger than threshold levels $T_{63}$–$T_{39}$ and smaller than threshold levels $T_{38}$ –$T_1$. In this case, processing of the first photon by the analog-to-digital conversion circuit 20a' (FIG. 3) yields a digital signal 34a of 000000, the second photon yields a digital signal 34a of 001000 (i.e., eight) and the third photon yields a digital signal of 011000 (i.e., twenty-four) as read from curve 120 in FIG. 7. In response to receipt of these three counter output signals 34a during the imaging interval, the cumulative adder provides an output signal value of thirty-two, or 100000.

Referring also to FIG. 7, a curve 120, denoted y=F(x), illustrates the desired arbitrary function to be approximated with the analog-to-digital conversion circuit 20a' of FIG. 3 (or circuit 20a" of FIG. 3A) and the digital logic circuit of FIG. 6 in response to threshold signal levels shown in FIG. 7. A simple way to determine the sixty-three threshold signal levels, and thus the spacing between adjacent threshold signal levels, is to solve the sixty-three separate equations i=F($T_i$) for i=1, 2, . . . 63 in a manner similar to that described for y=f(x) for FIG. 5. Also as previously described, better approximation to y=F(x) can be achieved using error minimization techniques to choose the sixty-three threshold levels. Not all sixty-three threshold levels are shown in FIG. 7 for simplicity of illustration. Only threshold values $T_{55}$, $T_{47}$, $T_{39}$, $T_{31}$, $T_{23}$, $T_{15}$ and $T_7$ are shown. Between adjacent illustrated threshold values seven other threshold levels are arranged in an obvious way. For example between $T_{39}$ and $T_{31}$ are located $T_{38}$, $T_{37}$, $T_{36}$, $T_{35}$, $T_{34}$ and $T_{33}$ in descending order according to subscript. As is apparent, rather uneven spacing of the threshold levels $T_1$–$T_{63}$ is required to generate an accurate approximation of the desired function 120 because of its varying slope. If function 120 had constant slope, i.e., were a straight line, the threshold levels would be equally spaced and a conventional analog-to-digital converter could be used. The expanded portion 124 of the curve 120 shows the step-like nature of the resulting digital approximation.

In the digital logic circuit embodiments of FIGS. 4 and 6, successive measurements from the detector array 12 are added and accumulated, respectively, after functions are generated and before being sent to the shift register 60. This is often the case, for example, when individual photon arrival measurements are weighted and summed.

Referring to FIG. 8, an illustrative threshold control circuit 30 for providing threshold signals 32a–32j includes a DC voltage source 130 and a plurality of adjustable resistors 134 coupled in series between the voltage source and ground. The threshold signals 32a–32j are provided at the interconnecting nodes between adjacent resistors, as shown.

The electrical resistance of each of the resistors 134 can be adjusted by manual, automatic, or semiautomatic means in order to provide the threshold signals 32a–32j for performing the desired function. More particularly, for automatic or semiautomatic adjustment, the input 36 is coupled to a controller 138 which generates signals 140 for independently setting and adjusting the resistance values of the variable resistors 134. As noted, the mechanism for adjusting the threshold signal levels may be operator actuable controls by which input 36 is provided or factory preadjustments as examples. In the case of factory preadjustment, the resistance of resistors 134 may be directly varied, without the use of a controller 138. The eleven resistors 134 allow for setting ten threshold signals 32a–32j and permit an additional adjustment to be made to compensate for component drift, variations, and other changes which might require calibration. For manual adjustment, the resistance of the eleven resistors 134 may be manually varied.

Figure 9:
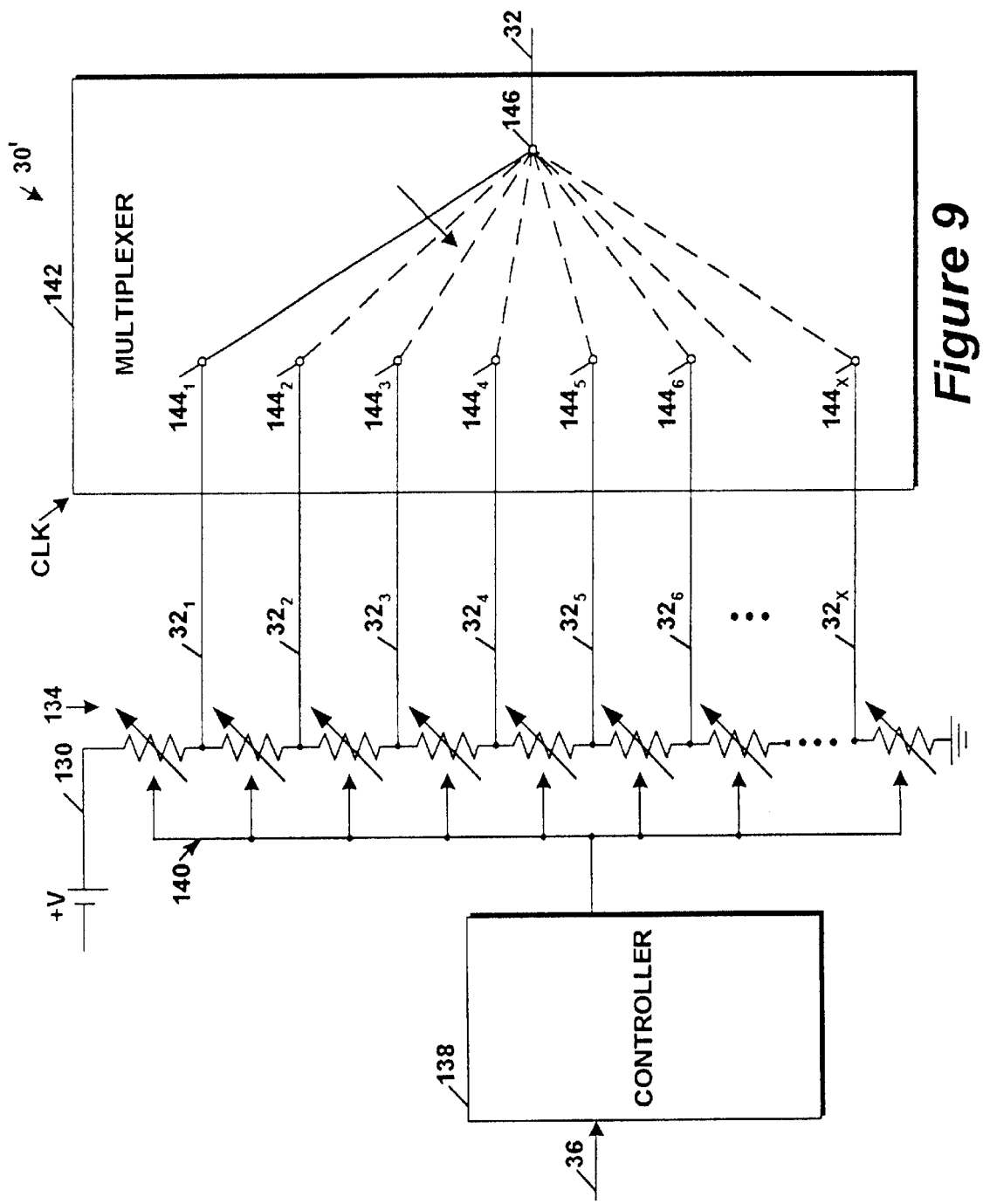
FIG. 9 is a schematic of an illustrative threshold control circuit for use with the analog-to-digital conversion circuit of FIG. 3.

Referring to FIG. 9, an illustrative threshold control circuit 30' for generating a single, time-varying threshold signal 32 for use with the analog-to-digital conversion circuit 20a' of FIG. 3 (or circuit 20a" of FIG. 3A) includes DC voltage source 130, adjustable resistors 134, and controller 138 providing control signals 140 as described in conjunction with FIG. 8. The circuit 30' additionally includes a multiplexer 142 having a plurality of input terminals $144_1$–$144_x$, each coupled to a respective signal line $32_1$–$32_x$ and a single output terminal 146 providing the time-varying threshold signal 32, where x=63 for use with the circuit of FIG. 3. In operation, the multiplexer 142 is controlled by a clock signal so as to sequentially couple the output terminal 146 to each of the input terminals $144_1$–$144_x$, thereby providing a threshold signal 32 which has the signal level $T_1$ of signal $32_1$ during a first interval, signal level $T_2$ of signal $32_2$ during a second interval, etc. It will be appreciated by those of ordinary skill in the art that various modifications to the circuits of FIGS. 8 and 9 are possible.

As will now be apparent to those of ordinary skill in the art, by adjusting the threshold signal(s) 32 provided by the threshold control circuit 30 to the analog-to-digital conversion circuits 20a–20n, different signal processing functions may be performed with the same imaging apparatus without requiring the use of different or adjustable digital logic circuitry. As noted above, different signal processing functions include different function types and/or different function parameters as may be desirable when imaging subjects having different properties. Illustrative properties of an imaged subject which may warrant signal processing variations include, but are not limited to tissue type or relative density of bone, organs, or tumors for medical diagnostics; relative brightness of stars, planets, or satellites for astronomy observation; differential thermal radiation from various parts of satellite spacecraft for problem or failure diagnosis; vegetation type or forest fire intensity for remote earth sensing; or differential density or reflectivity of manufactured parts for quality inspection and control applications.

Having described the preferred embodiments of the invention, it will now become apparent to one of ordinary skill in the art that other embodiments incorporating their concepts may be used.

For example, to generate more general functions, such as those that are non-monotonic (e.g., go up and then down), more complex logic would be required in the digital logic circuit to generate the proper integers or other discrete values as a function of the output of the respective analog-to-digital conversion circuit. For example, as the output of the analog-to-digital conversion circuit increases, the output of the digital logic circuit might first increase and then decrease. This is achievable with fixed digital logic circuit employing, for example, up and down counters.

It is felt therefore that these embodiments should not be limited to disclosed embodiments but rather should be limited only by the spirit and scope of the appended claims.

All publications and references cited herein are expressly incorporated herein by reference in their entirety.

What is claimed is:

1. An electronic imager comprising:
   a detector array comprising a plurality of radiation sensitive elements;
   an analog-to-digital conversion circuit responsive to an input signal from at least one of said plurality of radiation sensitive elements and to at least one threshold signal for converting said input signal into a digital signal; and
   a digital logic circuit responsive to said digital signal from at least one of said plurality of analog-to-digital conversion circuits for providing an output signal related to said input signal by a selectable function, wherein said function is selectable by adjusting said at least one threshold signal.

2. The electronic imager of claim 1 wherein said digital logic circuit is non-adjustable.

3. The electronic imager of claim 1 further comprising a threshold control circuit for adjusting said at least one threshold signal.

4. The electronic imager of claim 3 wherein said threshold control circuit is responsive to operator input for adjusting said at least one threshold signal.

5. The electronic imager of claim 3 wherein said threshold control circuit is operative to adjust said at least one threshold signal in response to an application of the electronic imager.

6. The electronic imager of claim 3 wherein said threshold control circuit is operative to adjust said at least one threshold signal in response to a characteristic of an object being imaged by said electronic imager.

7. The electronic imager of claim 1 wherein said function is selected from an exponential function and an arbitrary function.

8. The electronic imager of claim 1 wherein said analog-to-digital conversion circuit is selected from an integrating analog-to-digital conversion circuit or a direct analog-to-digital conversion circuit.

9. The electronic imager of claim 1 wherein each of said plurality of radiation sensitive elements is selected from a charge-coupled device and a semiconductor device.

10. The electronic imager of claim 9 wherein said semiconductor device comprises at least one of: gallium arsenide, cadmium zinc telluride, mercury cadmium telluride, silicon, gallium, and indium.

11. The electronic imager of claim 1 wherein said at least one threshold signal is preadjusted prior to use of said imager.

12. The electronic imager of claim 11 wherein said at least one preadjusted threshold signal is preadjusted in response to an application of the electronic imager.

13. The electronic imager of claim 11 wherein said at least one preadjusted threshold signal is preadjusted in response to a characteristic of an object being imaged by said electronic imager.

14. A method for processing an input signal from a radiation sensitive element with an electronic imager, comprising the steps of:
   converting said input signal into a digital signal by comparing said input signal to at least one threshold signal;
   processing said digital signal with a digital logic circuit to provide an output signal having a relationship with respect to said input signal determined by said at least one threshold signal; and
   adjusting said at least one threshold signal in order to change said relationship between said output signal and said input signal.

15. The method of claim 14 wherein said digital logic circuit is non-adjustable.

16. The method of claim 14 wherein said adjusting step includes adjusting said at least one threshold signal in response to operator input.

17. The method of claim 16 wherein said adjusting step includes adjusting said at least one threshold signal in response to an application of the electronic imager.

18. The method of claim 16 wherein said adjusting step includes adjusting said at least one threshold signal in response to a characteristic of an object being imaged by the electronic imager.

19. The method of claim 14 wherein said relationship between said output signal and said input signal is one of an exponential function and an arbitrary function.

20. An electronic imager comprising:
   a detector array comprising a plurality of radiation sensitive elements;
   an analog-to-digital conversion circuit responsive to an input signal from at least one of said plurality of radiation sensitive elements for converting said input signal into a digital signal; and
   a digital logic circuit responsive to said digital signal from said analog-to-digital conversion circuit for providing an output signal related to said digital signal by a fixed relationship, wherein said output signal is related to said input signal by an adjustable relationship.

21. The electronic imager of claim 20 wherein said analog-to-digital conversion circuit is further responsive to at least one threshold signal and said relationship between said output signal and said input signal is adjusted by adjusting said at least one threshold signal.

* * * * *